(12) United States Patent
Hsu et al.

(10) Patent No.: US 7,661,927 B2
(45) Date of Patent: Feb. 16, 2010

(54) SERIAL FAN WITH TOOTHED-TYPE CONNECTING ELEMENTS

(75) Inventors: Shuo-Shiu Hsu, Taoyuan Hsien (TW); Shun-Chen Chang, Taoyuan Hsien (TW); Wen-Shi Huang, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 474 days.

(21) Appl. No.: 11/645,495

(22) Filed: Dec. 27, 2006

(65) Prior Publication Data

US 2007/0173190 A1 Jul. 26, 2007

(30) Foreign Application Priority Data

Jan. 23, 2006 (TW) .............................. 95102482 A

(51) Int. Cl.
*F01D 9/02* (2006.01)

(52) U.S. Cl. .............. 415/208.2; 415/211.2; 415/121.2; 415/914

(58) Field of Classification Search .............. 415/121.2, 415/185, 191, 208.2, 914; 416/247 R
See application file for complete search history.

(56) References Cited

U.S. PATENT DOCUMENTS

| 3,342,254 | A | * | 9/1967 | Fujie ............................. 165/8 |
| 4,089,618 | A | * | 5/1978 | Patel ........................... 416/228 |
| 4,761,115 | A | * | 8/1988 | Hopfensperger ............ 415/119 |
| 5,603,607 | A | * | 2/1997 | Kondo et al. ................. 416/228 |
| 6,244,818 | B1 | * | 6/2001 | Chang ..................... 415/208.2 |
| 6,612,817 | B2 | * | 9/2003 | Lin et al. .................. 417/423.5 |
| 2004/0146395 | A1 | * | 7/2004 | Uselton ....................... 415/119 |

* cited by examiner

*Primary Examiner*—Igor Kershteyn
(74) *Attorney, Agent, or Firm*—Birch, Stewart, Kolasch & Birch, LLP

(57) ABSTRACT

A serial fan of the present invention includes a first fan and a second fan, each of which includes a housing and an impeller disposed in the housing. The housings respectively include a plurality of connecting elements, and there are several air-guiding recesses defined on the connecting elements of the first fan or the second fan, which can guide air to smoothly flow out from the housing so as to increase airflow and air pressure and reduce noise.

20 Claims, 8 Drawing Sheets

SERIAL FAN WITH TOOTHED-TYPE CONNECTING ELEMENTS

BACKGROUND OF THE INVENTION

1. Field of the Invention

The invention relates to a serial fan, and in particular to a serial fan providing at least one connecting element formed with a plurality of air-guiding recesses.

2. Description of the Related Art

FIG. 1 is an exploded view of two serial fans R assembled in series. The assembled fans R comprise a first fan 1 and a second fan 3 which have the same structure. The first fan 1 comprises a housing 10 and an impeller 11 disposed in the housing 10, and the second fan 3 comprises a housing 30 and an impeller 31 disposed in the housing 30. The housing 10 of the first fan 1 comprises a frame 101, a seat 102 disposed in the frame 101, and a plurality of ribs 103 disposed between the frame 101 and the seat 102. The housing 30 of the second fan 3 comprises a frame 301, a seat 302 disposed in the frame 301, and a plurality of ribs 303 disposed between the frame 301 to the seat 302. The configuration of the assembled fans R can increase airflow efficiency.

When the air sequentially travels through the impeller 11 and the ribs 103 of the first fan 1 and the ribs 303 and the impeller 31 of the second fan 3, however, the wind shear and noise are relatively increased.

BRIEF SUMMARY OF THE INVENTION

The invention provides a serial fan with a plurality of connecting elements. At least one connecting element is formed with a plurality of air-guiding recesses to efficiently guide air out of the fan and reduce air stagnation.

A serial fan of one embodiment comprises a first fan and a second fan. The first and second fans are assembled in series. The first fan comprises a first frame, a first seat disposed in the first frame, a plurality of first connecting elements disposed between the first frame and the first seat, and a first impeller disposed on the first seat. The second fan comprises a second frame, a second seat disposed in the second frame, a plurality of second connecting elements disposed between the second frame and the second seat, and a second impeller disposed on the second seat. A plurality of air-guiding recesses are defined on at least one of the edges of the first or second connecting elements to efficiently guide air so as to increase wind pressure and wind capacity and to reduce rotational noise. Furthermore, the air-guiding recesses can be defined on both edges of the first and second connecting elements.

The first and second connecting elements are ribs or static blades. The first connecting element of the first fan comprises a first edge facing the first impeller and a second edge opposite to the first edge, and the air-guiding recesses are defined on the first and second edges of the first connecting element of the first fan. The air-guiding recesses have toothed, arc, or acuminate cross-sectional profile.

The first impeller of the first fan, the first housing of the first fan, the second housing of the second fan, and the second impeller of the second fan are sequentially arranged, or the first impeller of the first fan, the first housing of the first fan, the second impeller of the second fan, and the second housing of the second fan are sequentially arranged.

Except for the first frame of the first fan and the second frame of the second fan assembled in series, the first and second frames can be integrally formed as a third frame so that the first and second impellers are disposed in the third frame.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 2:
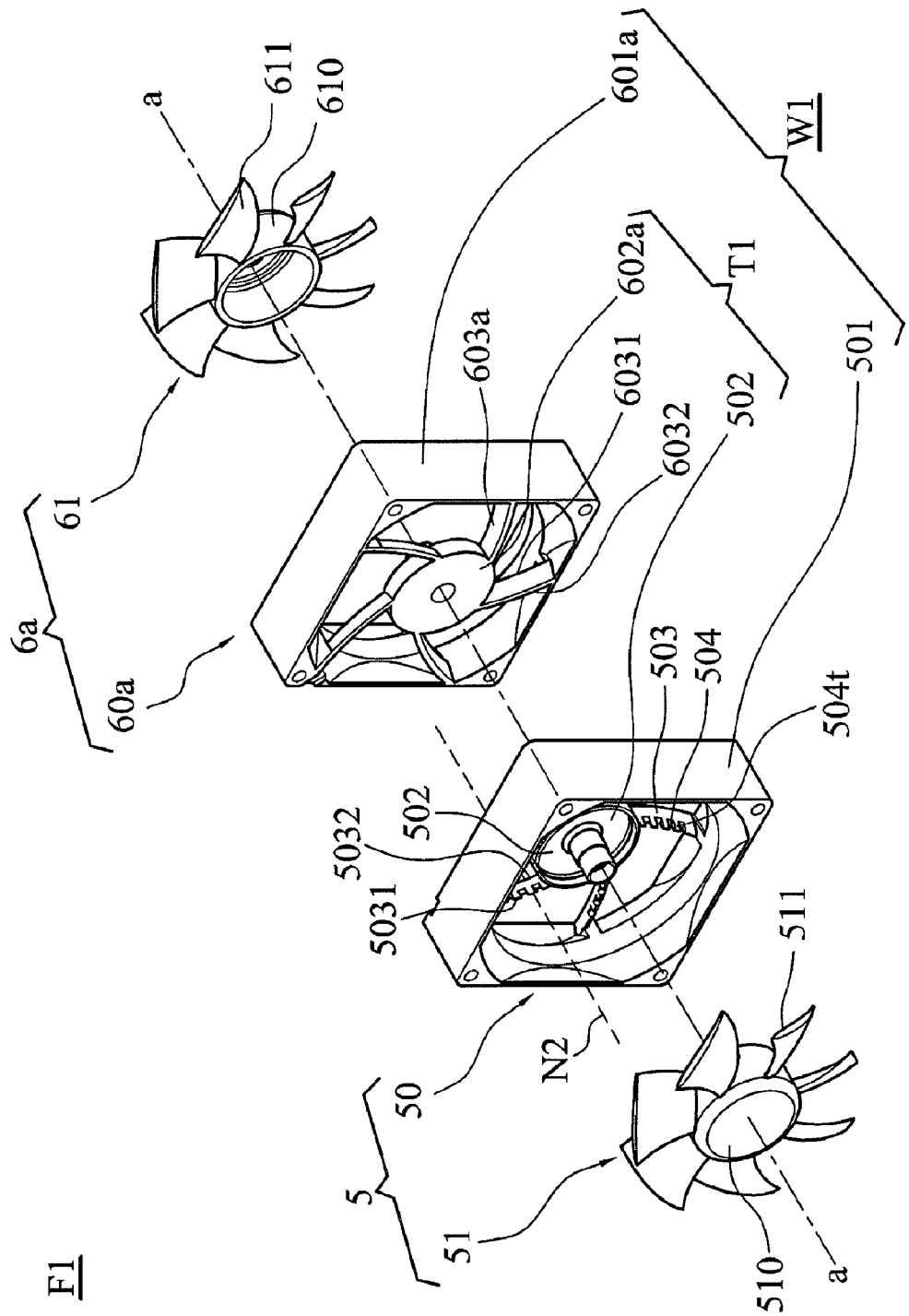
FIG. 2 is an exploded view of a serial fan (F1) of a first embodiment of the invention.
Figure 3:
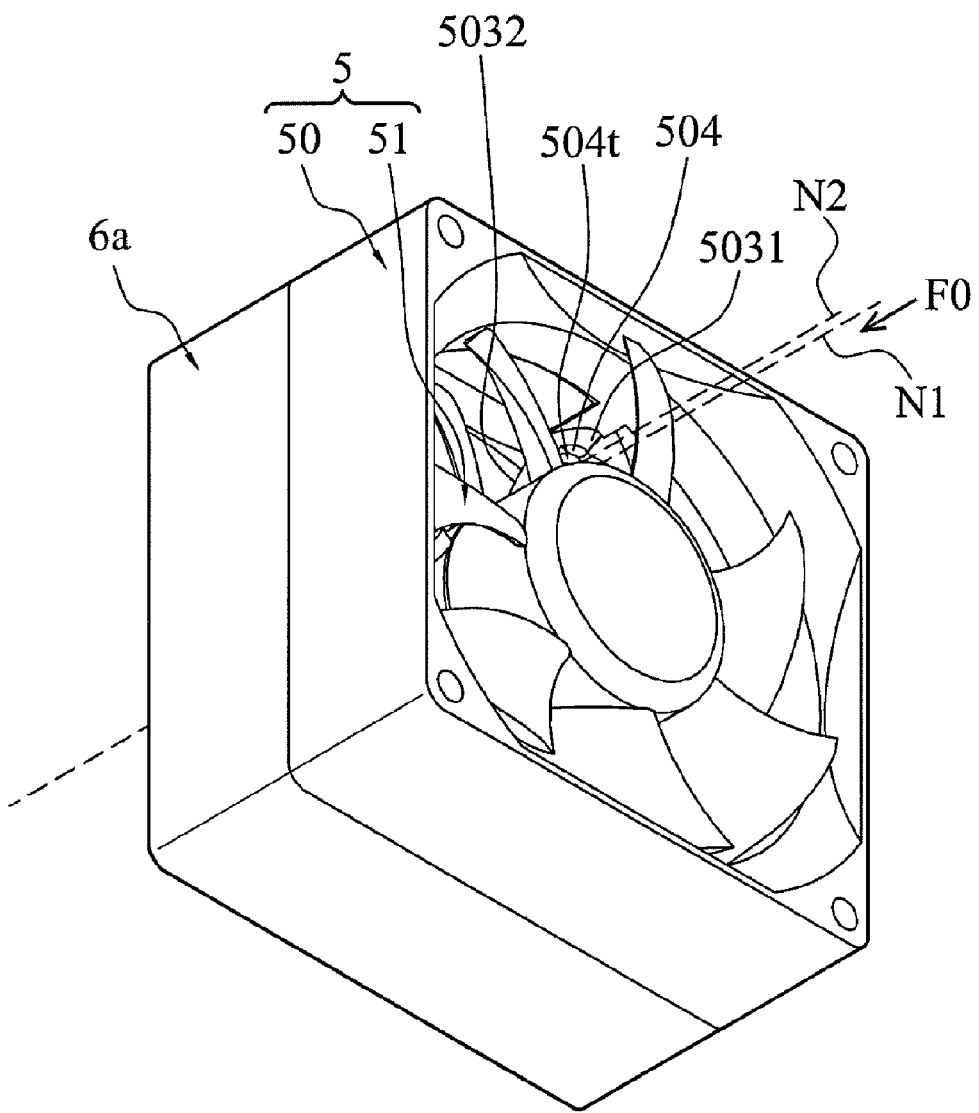
FIG. 3 is a perspective view of the assembled serial fan (F1) of FIG. 2.

In FIGS. 2 and 3, a serial fan F1 of a first embodiment comprises a first fan 5 and a second fan 6a arranged in series with respect to an axis a-a. The serial fan F1 is utilized to guide airflow F0 therein by traveling along a first line N1 (shown in FIG. 3).

The first fan 5 comprises a first housing 50 and a first impeller 51 disposed in the first housing 50. The first housing 50 comprises a rectangular first frame 501, a first seat 502 disposed in the first frame 501, a plurality of first connecting elements 503 radially and continuously disposed between the first frame 501 and the first seat 502, and a plurality of first air-guiding recesses/first toothed portions 504 radially and continuously arranged with respect to the axis a-a and defined on each of the plurality of first connecting element 503 and extended along a second line N2 parallel to the first line N1 of the airflow F0. In this embodiment, the plurality of first connecting elements 503 are formed in the shape of ribs. Each of plurality of first connecting elements 503 comprises a first edge 5031 and a second edge 5032. The first edge 5031 of each of the plurality of first connecting elements 503 is a front edge facing the first impeller 51, and the second edge 5032 of each of the plurality of first connecting elements 503 is a rear edge opposite to the first edge 5031. The plurality of first air-guiding recesses 504 are inwardly square indentations defined on the first edge 5031 of each of the plurality of first connecting elements 503 so as to form a rough profile thereon. That is, this rough profile of the plurality of first air-guiding recesses 504 is a profile which is radially and continuously extended with respect to the axis a-a. Note that the depth and width of the side view of the plurality of first air-guiding recesses 504 depend on the size of the fan and the actual requirements. Except for the square profile, the plurality of first air-guiding recesses 504 substantially have toothed, arc, peak, or acuminate cross-sectional profile which is radially and continuously extended with respect to the axis a-a. The first impeller 51 comprises a first hub 510 supported by the first seat 502 of the first housing 50 and a plurality of first blades 511 outwardly disposed on the first hub 510.

The second fan 6a comprises a second housing 60a and a second impeller 61 disposed in the second housing 60a. The second housing 60a comprises a rectangular second frame 601a, a second seat 602a disposed in the second frame 601a, and a plurality of second connecting elements 603a radially and continuously disposed between the second frame 601a and the second seat 602a. The first frame 501 and the second frame 601a form a frame structure or main frame W1, and the first seat 502 and the second seat 602a form a seat structure T1. In this embodiment, the plurality of second connecting elements 603a are formed in the shape of ribs or static blades. Each of the plurality of second connecting element 603a comprises a first edge 6031 and a second edge 6032. The first edge 6031 is a front edge facing the second impeller 61, and the second edge 6032 is a rear edge opposite to the first edge 6031. The second impeller 61 comprises a second hub 610 supported by the second seat 602a of the second housing 60a and a plurality of second blades 611 outwardly disposed on the second hub 610.

In the serial fan F1, the first impeller 51 of the first fan 5, the first housing 50 of the first fan 5, the second housing 60a of the second fan 6a, and the second impeller 61 of the second fan 6a are sequentially arranged along the axis a-a shown in FIG. 2. In this embodiment shown in FIG. 3, the first fan 5 and the second fan 6a can be assembled by screwing, engaging, riveting, adhering or other equivalent methods.

When the serial fan F1 is started, air is efficiently guided by the plurality of first air-guiding recesses 504 defined on of each of the plurality of the first connecting elements 503 of the first housing 50 so as to increase wind pressure and wind capacity. Furthermore, rotational noise can be decreased by the plurality of first connecting elements 503 because that the plurality of first connecting elements 503 are different in height and wind pressure differences are formed therebetween.

Figure 1:
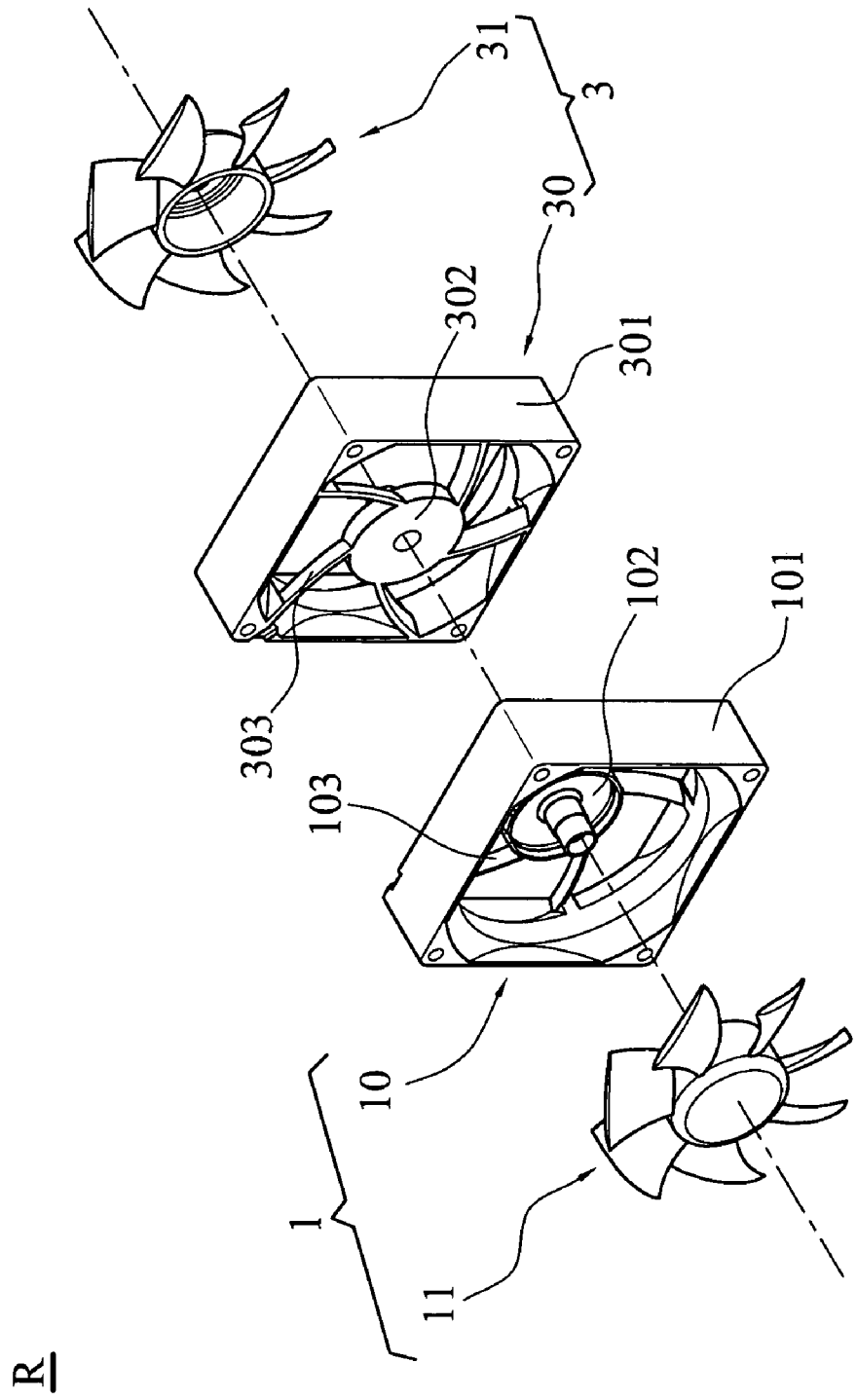
FIG. 1 is an exploded view of two fans assembled in series.
Figure 4:
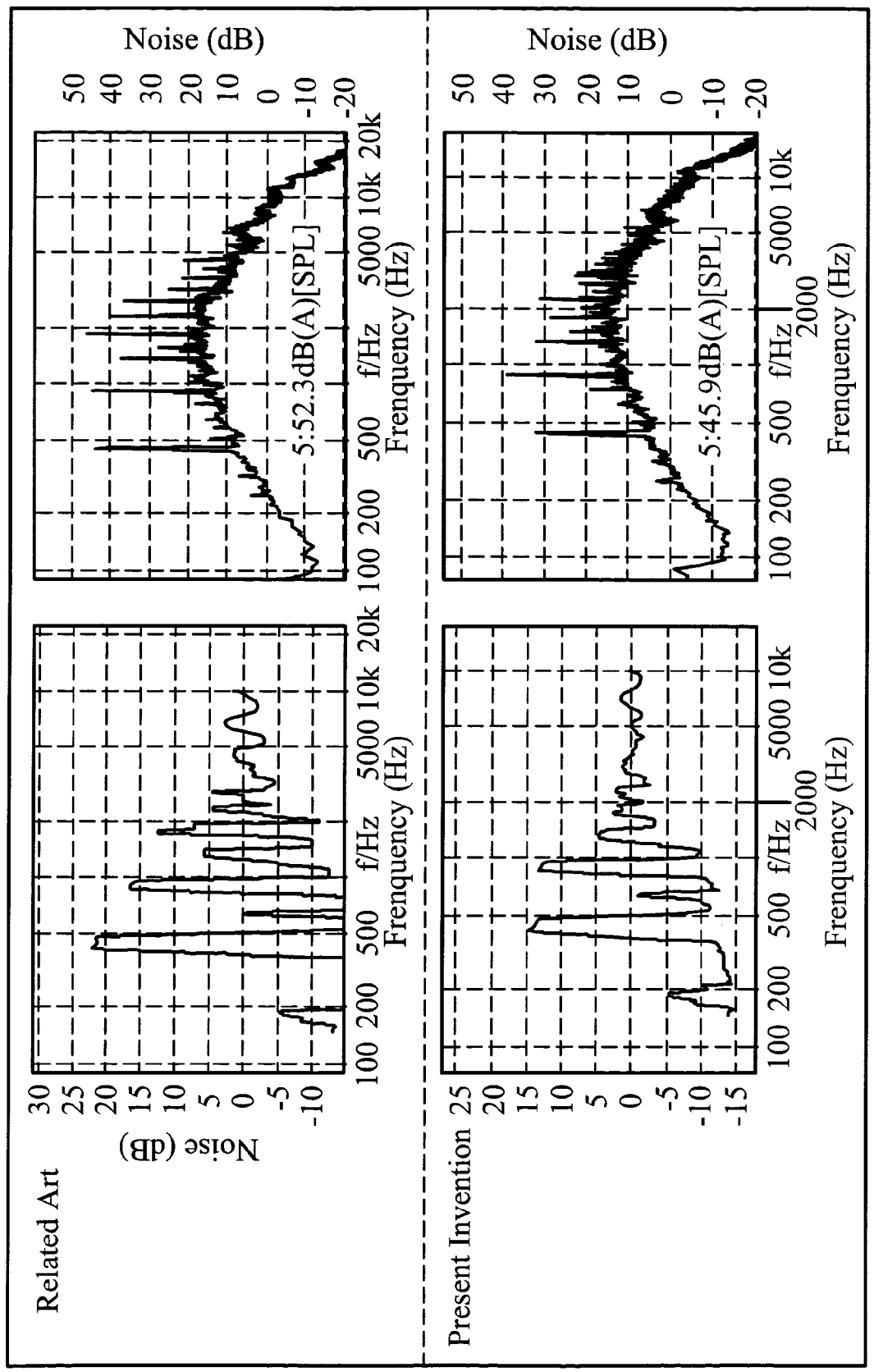
FIG. 4 shows two sets of diagrams showing noise values of the conventional serial fan (R) shown in FIG. 1 and the serial fan (F1) shown in FIG. 2 at the speed of 3,800 rpm.

In FIG. 4, two sets of diagrams respectively shows the noise values of the conventional serial fan R shown in FIG. 1 and the serial fan F1 of the present invention shown in FIG. 2 at the speed of 3,800 rpm. With respect to the conventional serial fan R providing 52.3 dB of averaged noise value, the serial fan F1 of one embodiment provides 45.9 dB of averaged noise value, accordingly decreasing rotational noise.

Figure 5:
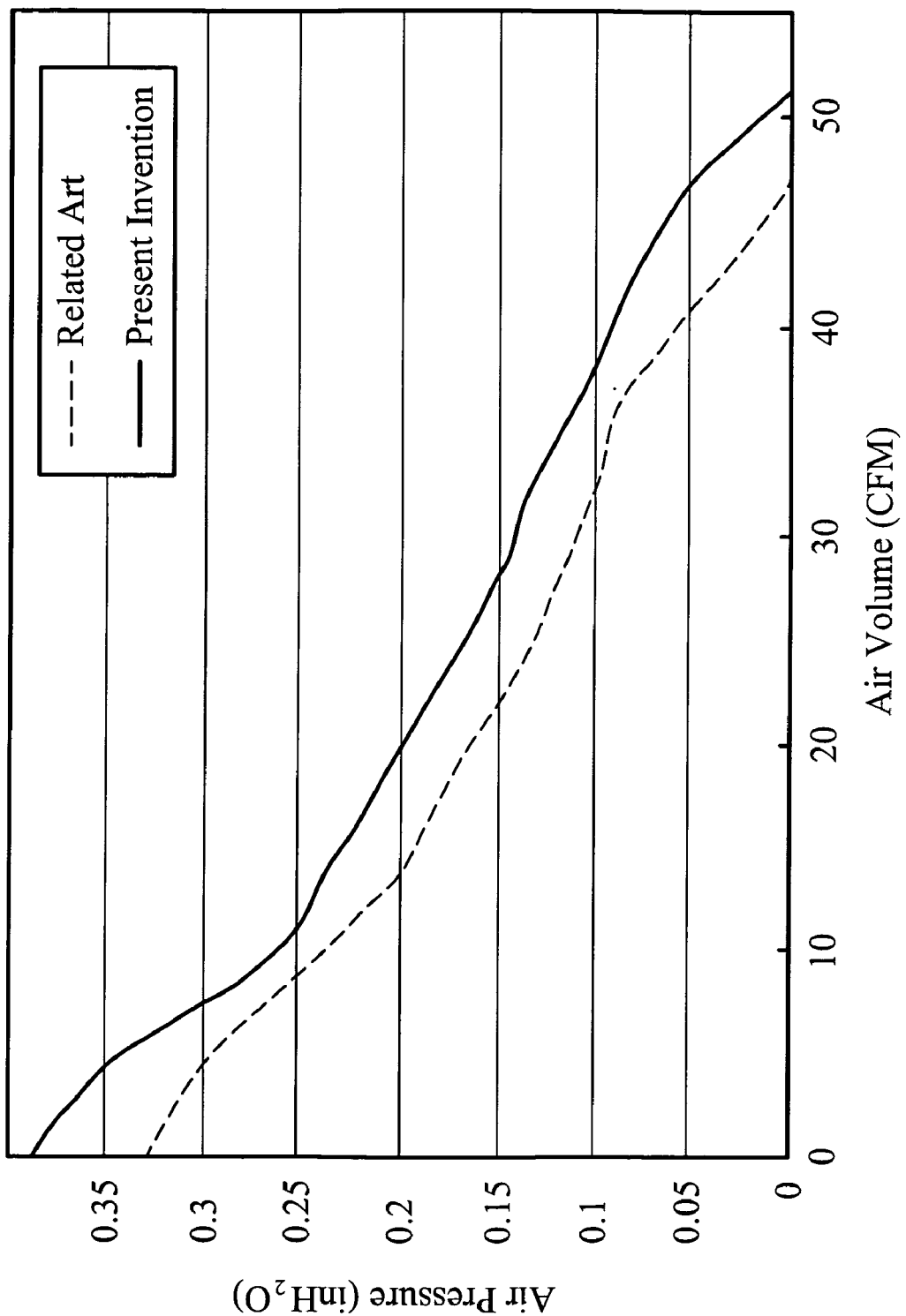
FIG. 5 is a characteristic diagram of the conventional serial fan (R) in FIG. 1 and the serial fan (F1) in FIG. 2, expressing air pressure and air volume under a noise of 39.4 dB.
Figure 6:
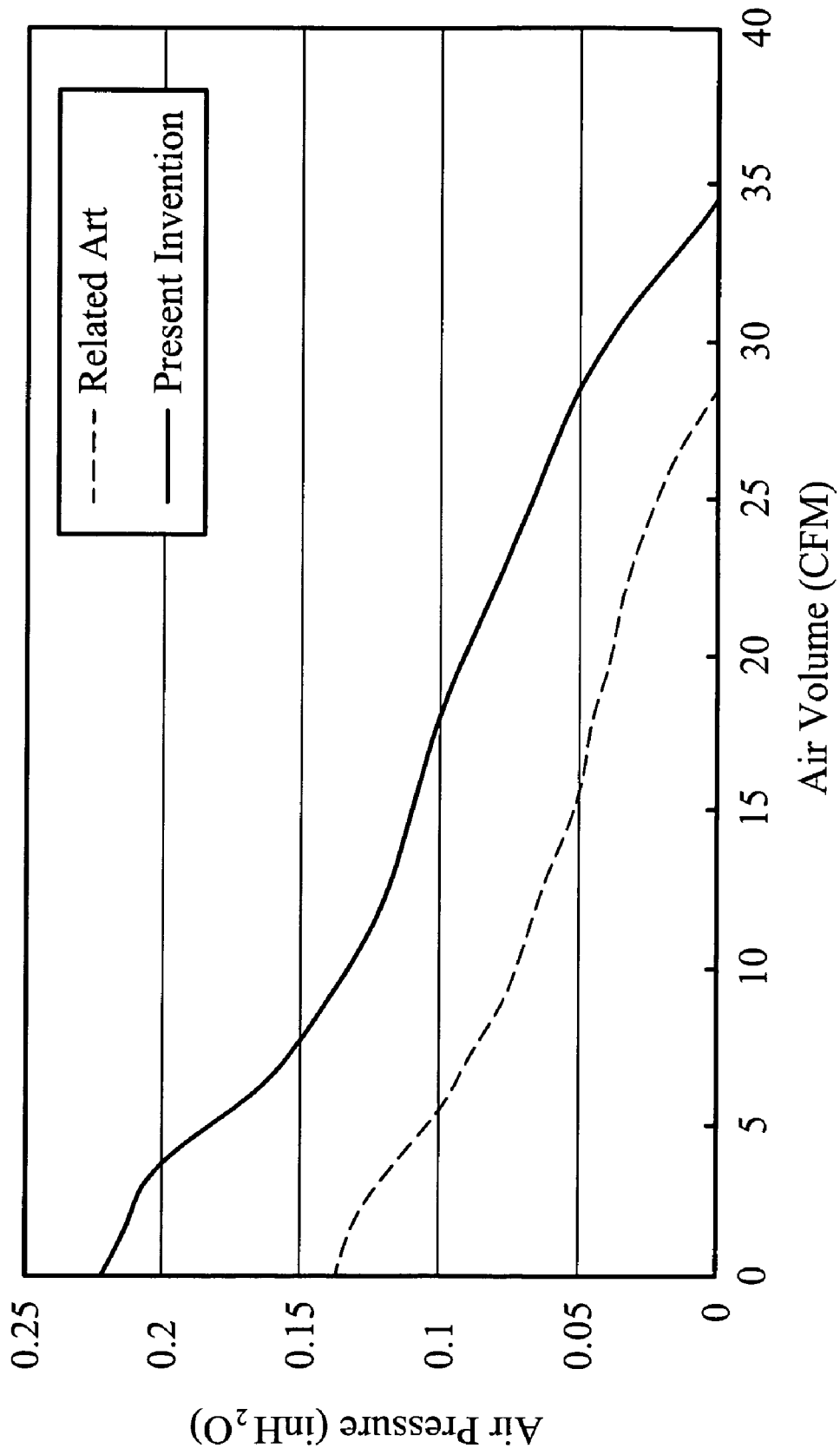
FIG. 6 is a characteristic diagram of the conventional serial fan (R) in FIG. 1 and the serial fan (F1) in FIG. 2, expressing air pressure and air volume under a noise of 38.7 dB.

In FIG. 5, a characteristic diagram shows air pressure and air volume under a noise of 39.4 dB of the conventional serial fan R shown in FIG. 1 and the serial fan F1 shown in FIG. 2. The serial fan F1 of the first embodiment provides a maximum increased air pressure of 17% and a maximum increased air volume of 8.5%. In FIG. 6, a characteristic diagram shows air pressure and air volume under a noise of 38.7 dB of the conventional serial fan R shown in FIG. 1 and the serial fan F1 shown in FIG. 2. The serial fan F1 of the first embodiment provides a maximum increased air pressure of 62% and a maximum increased air volume of 21%. At the same decibel level, the serial fan F1 of the invention provides a higher air pressure and air volume than the conventional serial fan R at high or low rotational speeds.

Except for the described plurality of first air-guiding recesses 504 defined on the first edge 5031, the plurality of first air-guiding recesses 504 can also be defined on the second edge 5032 of the first connecting element 503, or defined on both the first and second edges 5031, 5032 of the first connecting element 503.

The serial fan F2 comprises the first fan 5 and a second fan 6b. The second fan 6b comprises a second housing 60b and a second impeller 61 disposed in the second housing 60b. The second housing 60b comprises a second frame 601b, a second seat 602b disposed in the second frame 601b, a plurality of second connecting element 603b radially and continuously disposed between the second frame 601b and the second seat 602b, and a plurality of first second air-guiding recesses 604b/second toothed portions 604t radially and continuously arranged with respect to the axis b-b, defined on the first edge 6031 of each second connecting elements 603b and extended along a second line N2 parallel to the first line N1 of the airflow F0. The first frame 501 of the first housing 50 and the second frame 601b of the second housing 60b form a main frame W2, and the first seat 502 of the first housing 50 and the second seat 602a of the second housing 60b form a seat structure T2. In this embodiment, the first and second air-guiding recesses 504 and 604b of the first and second fans 5 and 6b have the same shape and size.

Additionally, the air-guiding recesses defined on the first edge 5031 of the first connecting element 503 can symmetrically correspond to the air-guiding recesses defined on the second edge 5032 of the first connecting element 503, or the air-guiding recesses defined on the first edge 5031 of the first connecting element 503 and the air-guiding recesses defined on the second edge 5032 of the first connecting element 503 can be asymmetrically or alternatively arranged. In other embodiments, the first connecting elements 503 can be ribs or static blades.

Figure 7:
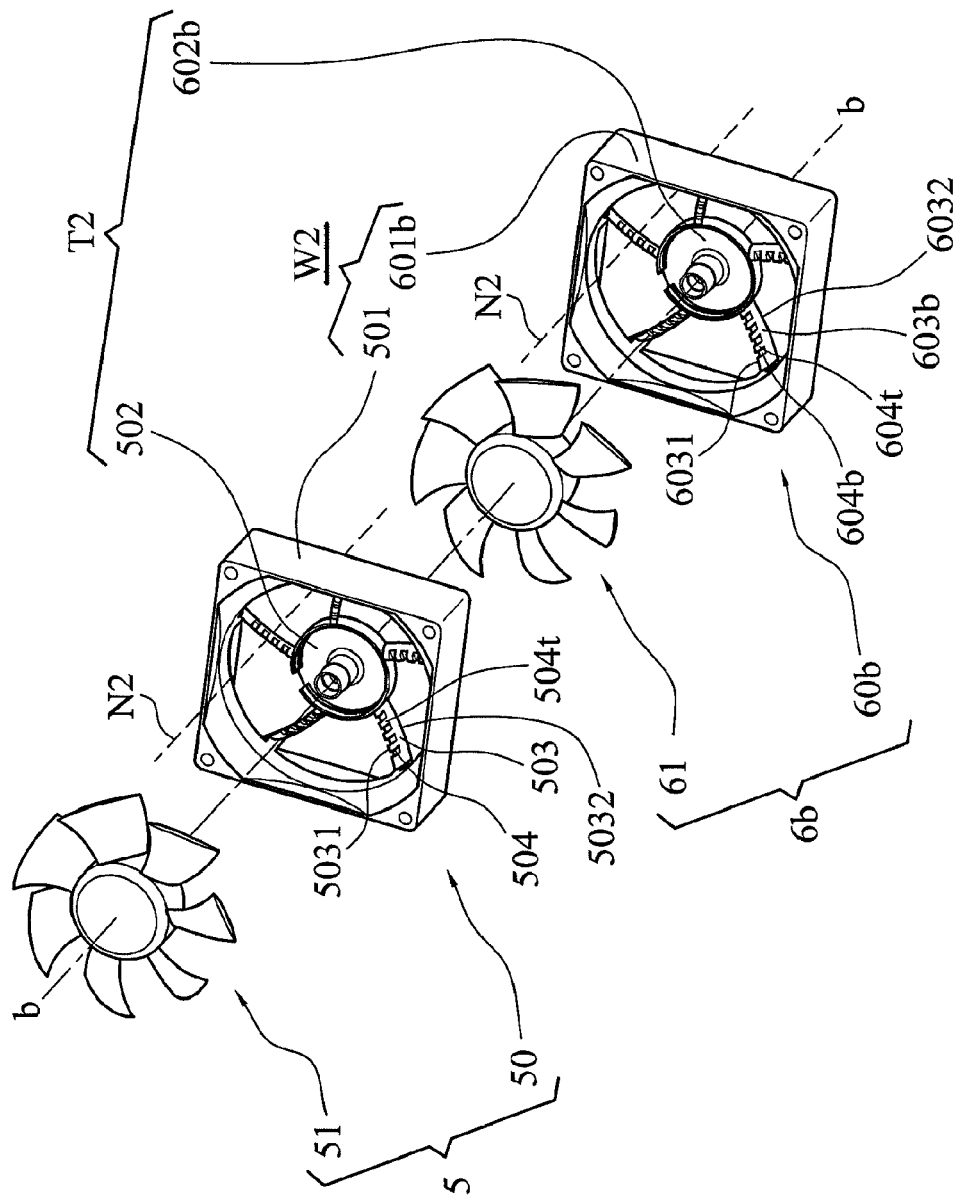
FIG. 7 is a perspective view of a serial fan (F2) of a second embodiment of the invention.

In FIG. 7, a serial fan F2 of a second embodiment comprises the first fan 5 and a second fan 6b. The serial fan F2 differs from the serial fan F1 in that the second fan 6b has the same structure as the first fan 5.

The first and second fans 5, 6b are isotropic with respect to an axis b-b shown in FIG. 7, i.e., the first air-guiding recesses 504 defined on the first connecting elements 503 of the first housing 50 of the first fan 5 and the second air-guiding recesses 604 defined on the second connecting elements 603b of the second housing 60b of the second fan 6b are directed to the same direction. Further, the first impeller 51 of the first fan 5 and the second impeller 61 of the second fan 6a are isotropic with respect to the axis b-b.

Except for the described arrangement of the elements of the first and second fans 5, 6a in the first embodiment, the elements of the first and second fans 5, 6b of the second embodiment can have another arrangement as shown in FIG. 7. In the serial fan F2, the first impeller 51 of the first fan 5, the first housing 50 of the first fan 5, the second impeller 61, and the second housing 60b of the second fan 6a are sequentially arranged along the axis b-b.

Except for the arrangements shown in FIGS. 2 and 7, the first and second frames 501 and 601b can also be integrally formed in other embodiments for receiving the first and second impellers 51 and 61.

Figure 8:
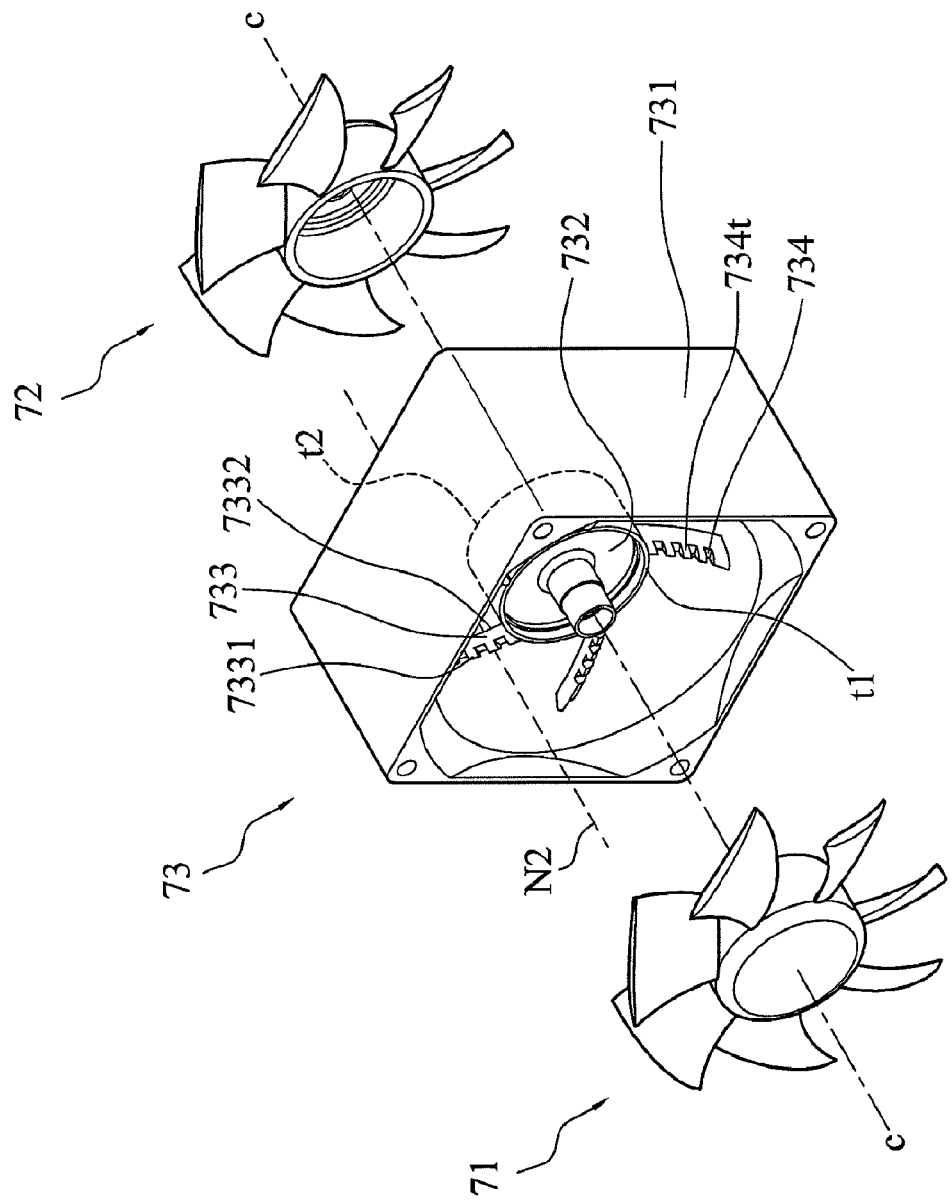
FIG. 8 is a perspective view of a serial fan (F3) of a third embodiment of the invention.

In FIG. 8, a serial fan F3 of a third embodiment comprises a first impeller 71, a second impeller 72 and a housing 73. The housing 73 comprises an frame 731, a seat structure 732 disposed in the frame 731, a plurality of connecting elements 733 radially and continuously disposed between the frame 731 and the seat structure 732, and a plurality of air-guiding recesses 734/toothed portions 734t radially and continuously arranged with respect to an axis c-c. The seat structure 732 has two opposite sides t1 and t2. The first and second impellers 71, 72 disposed in the housing 73 are supported by the sides t1 and t2 of the seat structure 732, respectively. The first and second impellers 71, 72 have the same structure as the first and second impellers 51, 61 of the first embodiment.

The connecting element 733 comprises a first edge 7331 and a second edge 7332. The first edge 7331 is a front edge facing the first impeller 71. The second edge 7332 is a rear edge opposite to the first edge 7331. The plurality of air-guiding recesses 734 radially and continuously arranged with respect to the axis c-c are defined on the first edge 7331 of each of the connecting elements 733 and extended along the second line N2 parallel to the first line N 1 of the airflow F0 so as to form a rough profile thereon. That is, this rough profile of the plurality of air-guiding recesses 734 is a profile which is radially extended with respect to the axis c-c. Note that the depth and width of the plurality of air-guiding recesses 734 depend on the size of the fan structure and the actual requirements. Except for the square profile, the plurality of air-guiding recesses 734 substantially have toothed, arc, peak, or acuminate cross-sectional profile. Except for the described plurality of air-guiding recesses 734 defined on the first edge 7331 of the connecting element 733, the plurality of air-guiding recesses 734 can also be defined on the second edge 7332 of the connecting element 733, or the air-guiding recesses 704 can be defined on both the first and second edges 7331, 7332 of the connecting element 733. Additionally, the air-guiding recesses defined on the first edge 7331 of the connecting element 733 can symmetrically correspond to the air-guiding recesses defined on the second edge 7332 of the connecting element 733, or the air-guiding recesses defined on the first edge 7331 of the connecting element 733 and the air-guiding recesses defined on the second edge 7332 of the connecting element 733 can be symmetrically, asymmetrically or alternatively arranged. The described connecting elements 733 can be formed in the shape of rib or static blade.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A serial fan utilized for guiding airflow traveling along a first line, comprising:
    a frame structure;
    a seat structure disposed in the frame structure;
    a plurality of connecting elements disposed between the frame structure and the seat structure;
    a plurality of air-guiding recesses radially arranged and defined on at least one of the plurality of connecting elements, extending along a second line parallel to the first line of the airflow; and
    at least one impeller disposed in the frame structure and supported by the seat structure.

2. The serial fan as claimed in claim 1, wherein the plurality of connecting elements are ribs or static blades.

3. The serial fan as claimed in claim 2, wherein each of the plurality of connecting element comprises a first edge and a second edge opposite to the first edge, and the plurality of air-guiding recesses are defined on the first and second edges or on one of the first and second edges of the plurality of connecting element.

4. The serial fan as claimed in claim 3, wherein the plurality of air-guiding recesses defined on the first and second edges of the plurality of connecting element are alternatively arranged or arranged in a symmetrical manner.

5. The serial fan as claimed in claim 3, wherein the plurality of air-guiding recesses have the same shape and size.

6. The serial fan as claimed in claim 5, wherein the plurality of air-guiding recesses have toothed, arc, or acuminate cross-sectional profile.

7. The serial fan as claimed in claim 1, wherein the plurality of air-guiding recesses defined on the at least one of the plurality of connecting elements are uniformly spaced on the connecting elements.

8. The serial fan as claimed in claim 1, wherein the seat structure comprises a first seat and a second seat, and the frame structure comprises a first frame for receiving the first impeller, the first seat and part of the plurality of connecting elements and a second frame for receiving the second impeller, the second seat and part of the plurality of connecting elements.

9. The serial fan as claimed in claim 8, wherein the first frame and the second frame of the frame structure are arranged in opposite.

10. The serial fan as claimed in claim 8, wherein the first frame and the second frame of the frame structure are isotropically arranged.

11. The serial fan as claimed in claim 8, wherein the plurality of connecting elements received in the first frame and the plurality of connecting elements received in the second frame respectively comprise the air-guiding teeth defined on the first edge or the second edge of the plurality of connecting elements, or both the first and the second edge of the plurality of connecting element, wherein the second edge is opposite to the first edge.

12. A serial fan comprising:
    a first fan comprising a first frame, a first seat disposed in the first frame, a plurality of first connecting elements disposed between the first frame and the first seat, a plurality of first air-guiding recesses defined on at least one of the plurality of first connecting elements, and a first impeller supported by the first seat; and
    a second fan comprising a second frame, a second seat disposed in the second frame, a plurality of second connecting elements disposed between the second frame and the second seat, a plurality of second air-guiding recesses defined on at least one of the plurality of second connecting elements, and a second impeller supported by the second seat;
    wherein the first fan and the second fan are assembled in series, each of the plurality of first connecting elements of the first fan comprises a first edge and a second edge opposite to the first edge thereof, each of the plurality of second connecting elements of the second fan comprises a first edge and a second edge opposite to the first edge thereof, and the plurality of first and second air-guiding recesses defined on the first and second edges of the plurality of first and second connecting elements are alternatively arranged.

13. The serial fan as claimed in claim 12, wherein the plurality of first connecting elements of the first fan and the plurality of second connecting elements of the second fan are ribs or static blades.

14. The serial fan as claimed in claim 12, wherein the plurality of first air-guiding recesses of the first fan and the plurality of second air-guiding recesses of the second fan have same shape and size.

15. The serial fan as claimed in claim 12, wherein the plurality of first air-guiding recesses of the first fan and the plurality of second air-guiding recesses of the second fan are in a shape of square, arc, peak side or combinations thereof.

16. The serial fan as claimed in claim 12, wherein the first fan and the second fan are isotropically arranged or arranged in opposite.

17. The serial fan as claimed in claim 12, wherein the first fan and the second fan are assembled by screwing, engaging, riveting, adhering or other equivalent methods.

18. The serial fan as claimed in claim 12, wherein the first frame of the first fan and the second frame of the second fan are integrally formed.

19. A serial fan, comprising:
- a first fan comprising a first frame, a first seat disposed in the first frame, a plurality of first connecting elements radially and continuously disposed between the first frame and the first seat, a plurality of first air-guiding recesses radially and continuously arranged and defined on at least one of the plurality of first connecting elements, and a first impeller supported by the first seat; and
- a second fan comprising a second frame, a second seat disposed in the second frame, a plurality of second connecting elements disposed between the second frame and the second seat, a plurality of second air-guiding recesses radially and continuously arranged and defined on at least one of the plurality of second connecting elements, and a second impeller supported by the second seat;
- wherein the first fan and the second fan are assembled in series, each of the plurality of first connecting elements of the first fan comprises a first edge and a second edge opposite to the first edge thereof, each of the plurality of second connecting elements of the second fan comprises a first edge and a second edge opposite to the first edge thereof, and the plurality of first and second air-guiding recesses are defined on the first edges of the plurality of first and second connecting elements.

20. The serial fan as claimed in claim 19, wherein the plurality of first and second air-guiding recesses of the first and second fan comprise profiles radially and continuously extended.

* * * * *